United States Patent [19]
Peyrotte et al.

[11] Patent Number: 5,675,288
[45] Date of Patent: Oct. 7, 1997

[54] METHOD OF LINEARIZING A NON-LINEAR AMPLIFIER, LINEARIZATION CIRCUIT AND AMPLIFIER INCLUDING A CIRCUIT OF THIS KIND

[75] Inventors: Christian Peyrotte; Paulo Baretto da Rocha, both of Toulouse; Jean-Luc Foucher, Seysses; Jean-Claude Azzara, Saint-Lys, all of France

[73] Assignee: Alcatel Espace, Nanterre Cedex, France

[21] Appl. No.: 499,373

[22] Filed: Jul. 7, 1995

[30] Foreign Application Priority Data

Jul. 8, 1994 [FR] France .................. 94 08491

[51] Int. Cl.[6] .................................................. H03F 1/26
[52] U.S. Cl. ....................................... 330/149; 330/136
[58] Field of Search ............................. 330/107, 109, 330/129, 136, 149

[56] References Cited

U.S. PATENT DOCUMENTS

| | | | |
|---|---|---|---|
| 5,101,173 | 3/1992 | DiPiazza et al. | 330/136 |
| 5,142,240 | 8/1992 | Isota et al. | 330/149 |
| 5,182,524 | 1/1993 | Hopkins | 330/149 |

FOREIGN PATENT DOCUMENTS

| | | |
|---|---|---|
| 2532491A1 | 3/1984 | France . |
| 2239755A | 7/1991 | United Kingdom . |

OTHER PUBLICATIONS

*1993 43rd IEEE Vehicular Technology Conference*, 18 May 1993, Secaucus NJ USA, pp. 672–675, XP393272, M. A. Briffa et al, "Dynamically Biased Cartesian Feedback Linearization".

*Primary Examiner*—Steven Mottola
*Attorney, Agent, or Firm*—Sughrue, Mion, Zinn, Macpeak, and Seas

[57] ABSTRACT

A linearization circuit for a non-linear amplifier optimizes the overall efficiency (>50%). To achieve high efficiency the amplifier is operated in class "E" or class "F" and near saturation, causing phase and amplitude non-linearity. Phase non-linearity is corrected conventionally by a phase error signal generated in a feedback loop. Amplitude non-linearity is corrected by operating on the power supply modulator of the non-linear amplifier in an open loop configuration, using the input signal power. Further, more refined correction of amplitude non-linearity can be effected by operating on an automatic gain control amplifier on the input side of the non-linear amplifier, the gain of the automatic gain control amplifier being controlled by an amplitude error signal generated in a feedback loop.

5 Claims, 3 Drawing Sheets

METHOD OF LINEARIZING A NON-LINEAR AMPLIFIER, LINEARIZATION CIRCUIT AND AMPLIFIER INCLUDING A CIRCUIT OF THIS KIND

BACKGROUND OF THE INVENTION

1. Field of the invention

The field of the invention is that of amplifiers and more particularly amplifiers that must combine very high efficiency with good phase and amplitude linearity over all of the dynamic range of the amplifier.

To be more precise, the field of the invention is that of power amplifier devices for amplifying electrical signals conveying information and transmitted in frequency bands from a few kilohertz (kHz) to several Gigahertz (GHz). The field of the invention is even more precisely that of so-called linear amplifiers introducing little or no amplitude or phase distortion into the signal transmitted.

The invention applies to any information transmission system requiring signal linearity in the amplifier subsystem with a constant high efficiency, regardless of the input signal, whereby the amount of energy required for amplification of the signal is significantly reduced.

Accordingly, the invention is particularly suitable for use on self-contained plants where the amount of energy available is low, such as satellites, aircraft and other portable devices of any kind.

2. Description of the Prior Art

The person skilled in the art knows that to optimize its efficiency an amplifier must operate near saturation. However, near saturation, electronic amplifiers are also closer to non-linear amplification conditions: the efficiency and the linearity of an amplifier near saturation are closely dependent on its class of operation.

There are various classes of amplifier for amplification of electrical signals:

Class A

This class of linear amplifiers is characterized by very low amplitude and phase distortion of the signal. The collector efficiency of a class A amplifier expressed as a percentage of the HF (RF) power transmitted for operation near the compression point of the amplifier is in practise in the order of 40% to 45%.

Class AB

Class AB, similar to class A, entails asymmetric biasing of the quiescent point of the transistor, reducing the mean power consumption compared to class A and in practise yielding collector efficiencies of 45% (high bias) to 55% (low bias). AM-PM distortion of the signal to be transmitted is increased, to a value in the range from 1° to 15°.

Class B—B push-pull

Strongly non-linear, of all the so-called linear classes, this class has the highest efficiency, at around 55% to 60%. It is suitable for transmission at high power.

Classes C, D, E, F

For higher efficiency, it is necessary to use strongly non-linear amplifiers such as class C, D, E and F amplifiers. These classes are characterized by strong signal operation of the amplifier transistor. The greatest efficiencies are achieved in the extreme operating condition in which the transistor switches between its saturated and off states, causing a load circuit tuned to the transmission frequency to resonate.

The solution to the problem of providing high efficiency linear amplifiers is thus to use a non-linear power circuit and to apply the necessary phase and amplitude corrections to linearize it.

Various methods of transmitting amplitude modulated signals with high efficiency are described in the literature. One example is the series-coupled collector modulation mode of transmission described in section 15-3 of "Solid State Radio Engineering" by Krauss, Bostian and Raab, whereby the amplifier stages of the RF subsystem are fed with power via a class S (switching) amplifier. The RF output is therefore modulated by an AC modulating signal fed to the input of the class S amplifier.

In the absence of the modulating signal the output voltage of the class S amplifier is VCC/2. Modulation is effected by modulating the voltage at the output of the class S amplifier from 0 to VCC (0 to 100%

This principle is open to criticism:

The amplitude modulation transmission is open loop and consequently the information transmitted is dependent on the linearity qualities of the complete system.

Operation at maximum efficiency is obtained only for a particular operating point linking the RF input power and the power supply.

FIG. 1 shows one prior art linearization method. This method is an analog method.

The FIG. 1 analog linearization circuit includes a phase linearization loop and an amplitude linearization loop (2).

Linearization is effected by two independent servo loops:

A phase loop 1.

An amplitude loop 2.

The input signal is divided into amplitude and phase components by a limiter 3 adapted to retain only the phase and by an amplitude detector 13 adapted to retain only the amplitude.

The output signal is likewise divided into amplitude and phase components by a limiter 4 and a detector 14.

Phase loop (1)

The phase loop 1 comprises an input limiter 3, an output limiter 4, a phase comparator 5 and a phase-shifter 6.

A signal representative of the output phase is sampled by a first output side coupler 8 and a signal representative of the input phase is sampled by a first input side coupler 7.

The output phase is compared to the input phase by the phase comparator 5 the output of which, proportional to the phase error, drives an active phase-shifter 6 in series with the input of the NL amplifier 10 to be linearized.

The phase-shifter 6 causes a phase-shift in the input signal with the opposite phase to the phase-shift caused by the amplifier 10, to cancel the latter. The phase is thus linearized.

Amplitude loop (2)

The amplitude loop 2 exploits the fact that the amplitude of the output signal of the amplifier 10 is proportional to its supply voltage.

Modulation of its supply voltage therefore causes AM variation at the output.

A signal representative of the input amplitude is sampled by a second input side coupler 17 and a signal representative of the output amplitude is sampled by a second output side coupler 18.

The amplitude loop 2 comprises an input amplitude detector 13, an output amplitude detector 14, two error amplifiers 15, 16 and a power modulator 11.

The output amplitude is compared to the input amplitude via the error amplifier 15. The amplitude error is then added to the amplitude of the input signal in the mixer 16 and provides a reference voltage for the power modulator 11.

This reference voltage modulates the supply voltage of the NL amplifier 10 to reproduce at the output the amplitude modulation of the input signal. The power required by the power supply modulator 11 is supplied via the unregulated busbar 50 of the platform. The aim is to optimize the electrical efficiency of the modulated RF power given the output power supplied by the source 50.

This type of modulation by the power supply introduces unwanted AM-PM conversion. This is also compensated by the phase loop.

However, this method of linearization has disadvantages.

The power supply modulator 11 is in the amplitude servo loop 2 which makes it very difficult to achieve servo stability. The filter of the modulator is in the bandwidth of the loop. This limits the servo bandwidth and therefore the bandwidth of the signal transmitted.

This type of linearized system does not operate the non-linear amplifier at its point of maximal efficiency. The latter can be achieved only for a given combination of supply voltage and input power.

The prior art documents include the following three patent applications: D1=EP 471 346 A1 (FUJITSU), D2=EP 561 346 A1 (MITSUBISHI) and EP-359 477 A2 (NOKIA). The document most relevant to the invention is document D1 (FUJITSU) which discloses a principle on which the present invention is founded.

The FUJITSU document teaches the use of an amplifier operating in a non-linear region, i.e. near saturation, to optimize efficiency in combination with correction of non-linearity by a linearizer. Unlike our invention, the FUJITSU amplifier operates in class "C"; we prefer class "E" or class "F".

A common feature of the various embodiments of the invention described is the use of an automatic gain control (AGC) amplifier on the input side of the nonlinear amplifier 10 to provide at the input of the amplifier 10 a signal at the latter's optimal operating point. This feature, to some degree conventional in telecommunications with mobile terminals, is known from document D3 (NOKIA) for example. Unlike the invention as described below, the optimal operating point is determined by a constant output power and has a low dynamic range.

Class "C" does not have sufficient efficiency for the intended applications, which require a long battery life. The linearization system proposed in document D1 is not suitable for class "E" or class "F" amplifiers operating at high frequencies, as AM/PM distortion would become excessive.

One solution to this problem, known from document D2, for example, is to provide an AGC amplifier on the input side of the non-linear amplifier 10 to reduce the dynamic range of the signal applied to the input of the latter. The objective in this document is to obtain a constant gain for an output power which varies with a low dynamic range, rather than flat gain over a wide dynamic range of the input signal, which constitutes the object of the present invention.

SUMMARY OF THE INVENTION

The invention is directed to remedying these drawbacks of the prior art. To this end, the invention consists in a method of linearizing a non-linear amplifier, comprising correction of phase non-linearity and correction of amplitude non-linearity, said phase correction being effected by an electrically controlled phase-shifter on the input side of said non-linear amplifier and controlled by a phase comparator which measures phase non-linearity introduced by said nonlinear amplifier in a first feedback loop, said amplitude non-linearity being corrected in two stages, a first correction being effected by operating on a power supply modulator of said non-linear amplifier in an open loop configuration and a more refined second correction being effected by an automatic gain control amplifier on the input side of said non-linear amplifier and controlled by an input-output amplitude error signal generated in a second feedback loop.

The invention also consists in a linearizer circuit for a non-linear amplifier, adapted to operate at microwave frequencies, including means for correcting phase non-linearity and means for correcting amplitude non-linearity, said phase correction means including a phase comparator and an electrically controlled phase-shifter in a feedback loop and said amplitude nonlinearity correction means including:

a power supply modulator for modulating the power supply of said non-linear amplifier, the output voltage of which is controlled by the amplitude of said input signal in an open-loop configuration, and an automatic gain control amplifier on the input side of said non-linear amplifier, controlled by an amplitude error detector in a closed loop configuration.

One specific embodiment of the invention concerns a linearizer circuit for a non-linear amplifier, adapted to operate at microwave frequencies, including phase nonlinearity correction means and amplitude non-linearity correction means, said phase correction means including:

an electrically controlled phase-shifter controlled by a first control signal, a phase comparator having at least two inputs and one output, a first coupler on the input side of said non-linear amplifier and a first coupler on the output side of said non-linear amplifier, said first input side coupler providing a signal representative of the phase of said input signal before amplification at one of said inputs of said phase comparator and said first output side coupler providing a signal representative of the output phase after amplification at the other of said two inputs of said phase comparator, comparison of the phase of the signals at said two inputs of said phase comparator producing a signal representative of the relative phase-shift between the two signals at the output of said phase comparator, said output being adapted to be connected to the control input of said phase-shifter in order to control the phase of said input signal in such manner as to cancel any phase non-linearity due to non-linear amplification;

and said amplitude non-linearity correction means including:

a power supply modulator for modulating the power supply of said non-linear amplifier, the output voltage of which is electrically controlled by a second control signal applied to a control input of said modulator, a power comparator having at least two inputs and one output, a second coupler on the input side of said non-linear amplifier and a second coupler on the output side of said non-linear amplifier, an automatic gain control amplifier in series with and on the input side of said non-linear amplifier, the gain of which is electrically programmable by an amplitude corrector signal, said second input side coupler providing a signal representative of the amplitude of said input signal at said control input of said modulator in order to control the supply voltage of said non-linear amplifier, said second input side coupler also providing the same signal at one of said inputs of said power comparator and the second coupler on the output side providing a signal representative of the amplitude of the output signal after amplification at the other of said inputs of said power comparator, producing a signal representative of the input-output amplitude error between the two signals, said error signal being applied to the control input of said automatic gain control amplifier in order to control the amplitude of the input signal in such manner as to cancel any amplitude non-linearity due to non-linear amplification.

In one embodiment of the invention the power supply modulator of the non-linear amplifier is controlled by an error signal in order to reproduce the simplified AM envelope of the input signal. The gain of the AGC amplifier on the input side of the non-linear amplifier is controlled by the phase comparator.

In a different embodiment of the invention the various functions are implemented by digital components and software. One example is shown in FIG. 4, which represents a digital solution similar to the analog solution of FIG. 2.

Further features and advantages of the invention will emerge from the following description of a few embodiments of the invention and from the appended drawings.

DETAILED DESCRIPTION OF THE PREFERRED EMBODIMENTS

The person skilled in the art will readily conceive of alternative embodiments of the invention based on the general principles of the invention as explained by means of the following examples.

The figures show non-limiting examples of embodiments of the invention. The same components appearing in more than one figure are identified by the same reference number.

Figure 1:
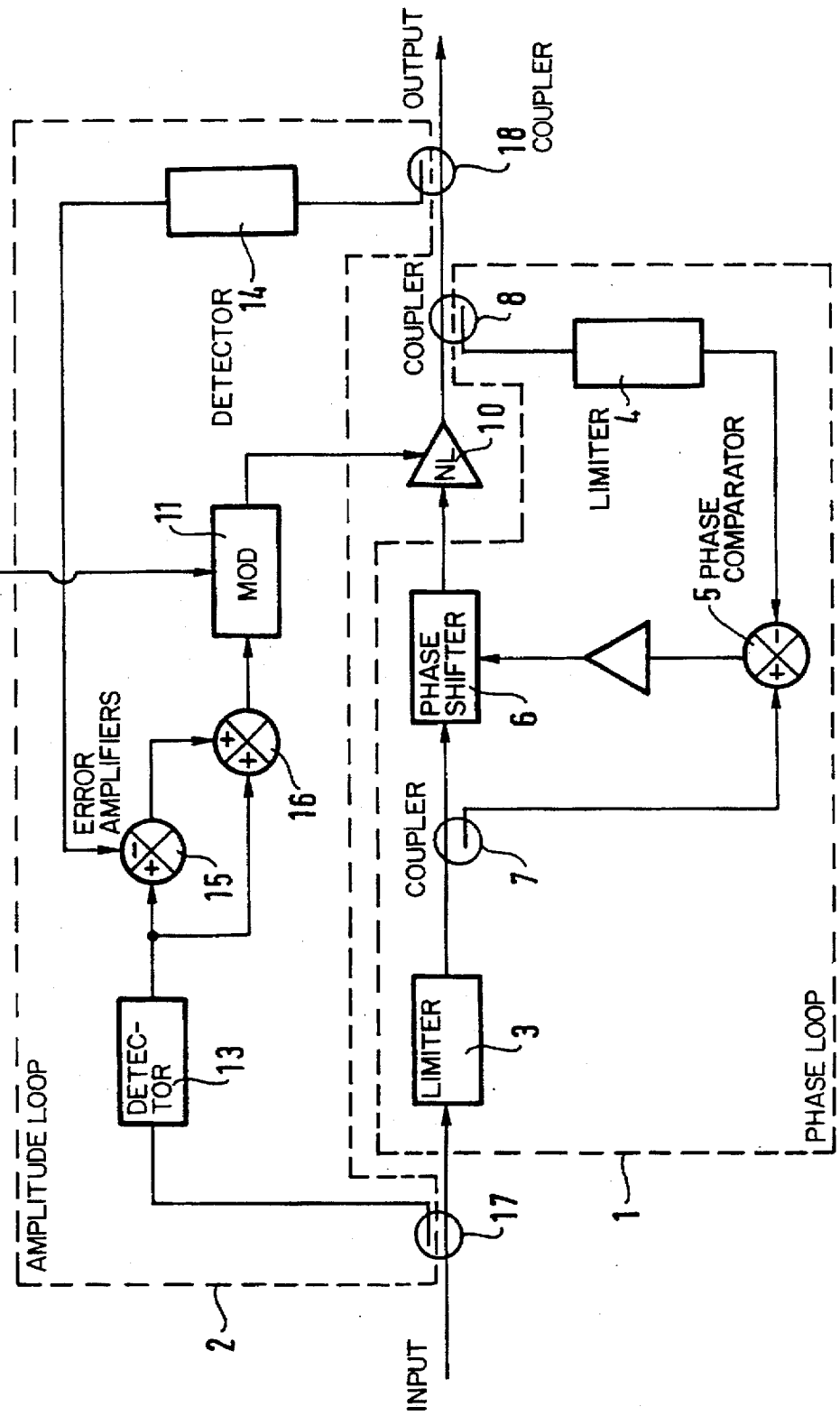
FIG. 1, already described, shows a prior art analog linearization circuit.
Figure 2:
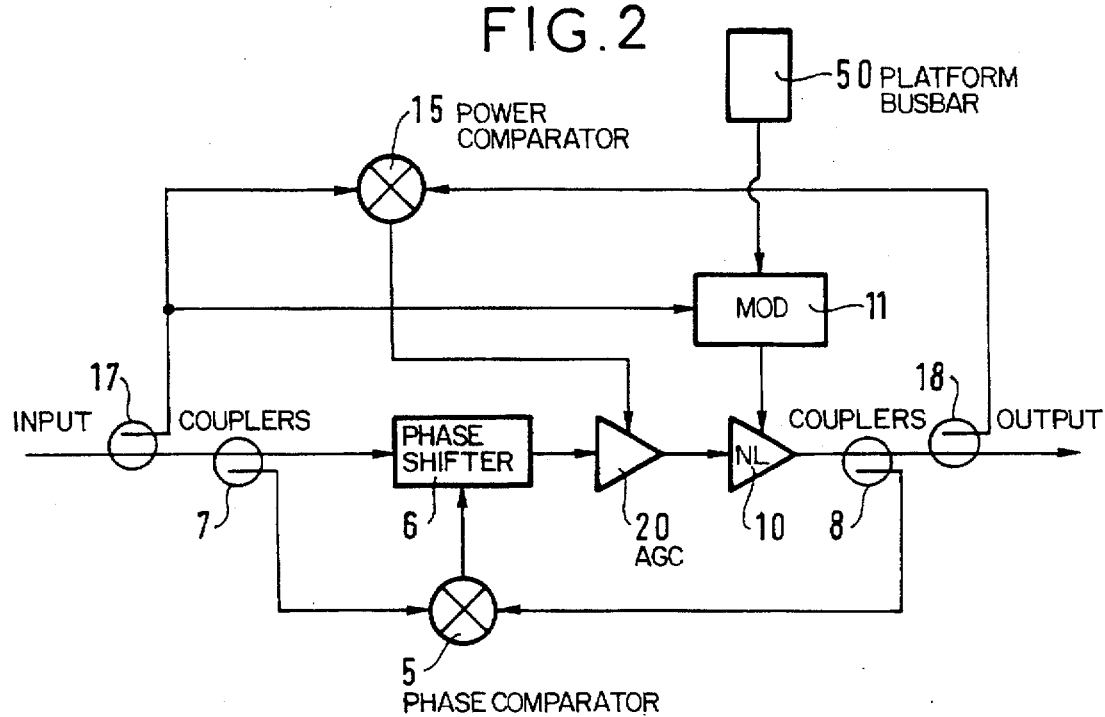
FIG. 2 shows one embodiment of an amplitude and phase linearization circuit of the invention including a switching mode modulator the output of which constitutes the power supply to a non-linear amplifier, the power supply modulator being controlled in an open loop configuration by a signal representative of the amplitude of the input signal to be amplified.

FIG. 2 shows a first embodiment of the invention. As in FIG. 1, phase correction is effected in a feedback loop. This loop comprises the same components as in FIG. 1 and operates in the same manner, as described below.

The linearization principle of the invention is explained below.

The open loop operating on the power supply modulator 11 procures a ratio of three between the switching frequency and the modulation frequency which expands the bandwidth of the linearization circuit whilst retaining good linearity and excellent efficiency.

As in FIG. 1, the power supply modulator 11 operates on the gain of the NL amplifier 10 to modify the power supply voltage or current as a function of the amplitude of a signal applied to the control input of the modulator 11.

The power supply voltage of the NL amplifier 10 is therefore controlled by the instantaneous dynamic range of the input signal in an open loop configuration, i.e. outside the servo loop which improves servo stability.

The input-output amplitude error is then determined in a closed loop configuration by the power comparator 15 which has two inputs respectively connected to a coupler 17 on the input side of the NL amplifier 10 and a coupler 18 on the output side of the NL amplifier 10. The output of the power comparator 15 drives the control input of an AGC amplifier 20 on the input side of the NL amplifier 10.

The input-output amplitude error then controls the gain of the AGC stage 20. This stage merely corrects small amplitude errors which are not dealt with by the modulator 11 and causes the NL amplifier 10 to operate at its maximum efficiency over all of the dynamic range of the AM signal.

The second servo loop corrects input-output phase errors using a phase-shifter 6 on the input side of the AGC amplifier 20. The phase errors due to the phase-shifter and to automatic gain control are also attenuated by the loop gain of the servo system. The servo accuracy is dependent only on the accuracy of the two limiters 3, 4 providing the input-output phase information. These limiters are in an area attenuated by the information sampling couplers, and procure good reproducibility of the signal over its dynamic range.

Another advantage of the FIG. 2 embodiment is the high speed of the power control action of the modulator, which is controlled directly by the input signal. Also, control stability is improved and spurious oscillations are eliminated.

Nevertheless, the main object achieved by the invention is the provision of linear amplifiers having low third order intermodulation combined with a high efficiency in terms of its use of energy supplied by the power supply busbar 50 of the platform, this efficiency exceeding 50% for all RF power levels of the input signal to be amplified.

The definition of this efficiency η is:

$$\eta \% = \frac{P_{SHF} - P_{EHF}}{P_{BUS}}$$

where $P_{SHF}$ is the RF output power,
$P_{EHF}$ is the RF input signal power, and
$P_{BUS}$ is the electric power supplied by the platform busbar 50.

This principle provides linear amplifiers with a compression point parametered in terms of given limits for the power supply voltage of the amplifier stages.

Figure 3:
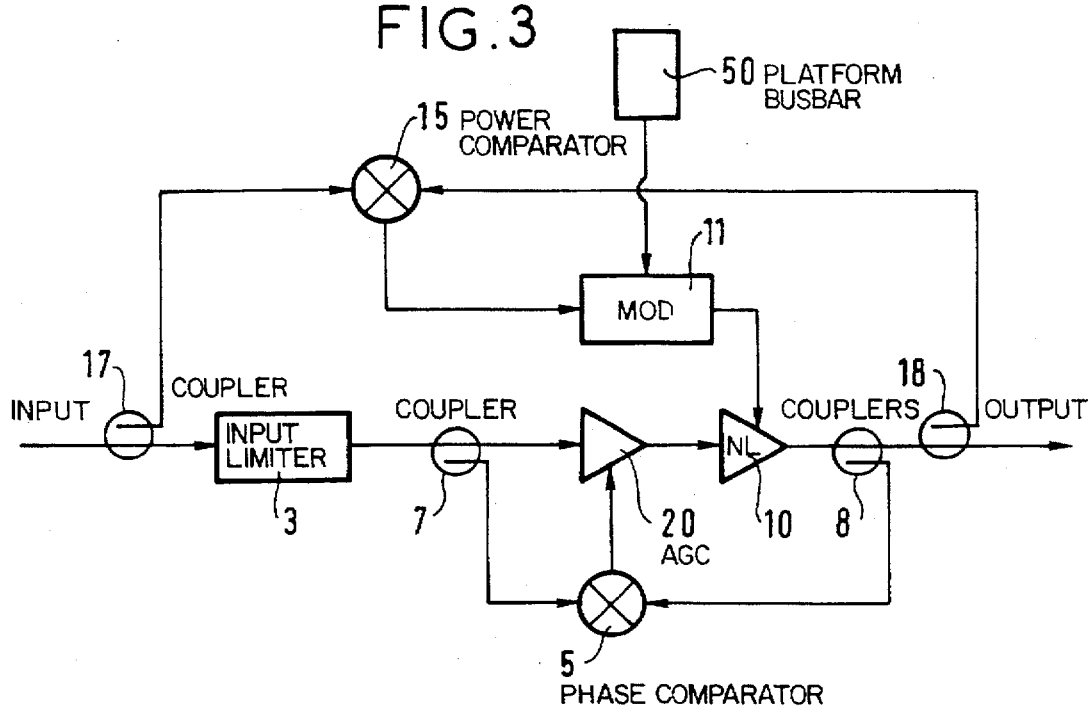
FIG. 3 shows a different embodiment of the invention including a switching mode modulator controlled by a feedback loop.

FIG. 3 shows a different embodiment of the invention. The circuit configuration is similar to that of the FIG. 2 circuit, with a few exceptions. The power supply modulator 11 is controlled in a closed loop configuration by the error signal supplied by the power comparator 15.

The amplitude modulation is corrected and transmitted via the power supply modulator 11 of the NL stage 10.

The input-output phase error controls the AGC stage 20. This configuration simplifies the servo systems, avoids the need for a phase-shifter and enables operation of the NL amplifier 10 at its point of maximum efficiency regardless of the input signal.

This latter result is based on the principle that an increase in the input RF power causes an increase in the supply voltage of the NL stage 10. This voltage increase induces a phase variation <0 at the amplified output. Knowing that the phase variation induced for an increase in $P_{EHF}$ will induce a phase variation >0, the phase error must increase the gain of the AGC amplifier 20. This also maintains the power supply condition, the RF of the NL stage 10 giving the maximum efficiency.

The linearization principle is as follows:

The input signal is divided into its amplitude and phase components. The input amplitude component is compared to the output amplitude component. The error signal controls the modulator 11 which supplies the power supply voltage to the NL stage 10. The function of this servo system is to restore the amplified AM envelope of the input signal.

Only the phase component of the signal is retained at the output of the input limiter 3. This component is amplified by an AGC stage controlling the NL amplifier 10. The function of the AGC stage 20 is to vary the input power of the NL stage 10 so that the latter operates at its point of maximum efficiency over all of the AM dynamic range of the input signal.

The gain control signal of the AGC 20 is the input-output phase signal. The function of this servo system is to restore at the output the phase of the input signal.

Figure 4:
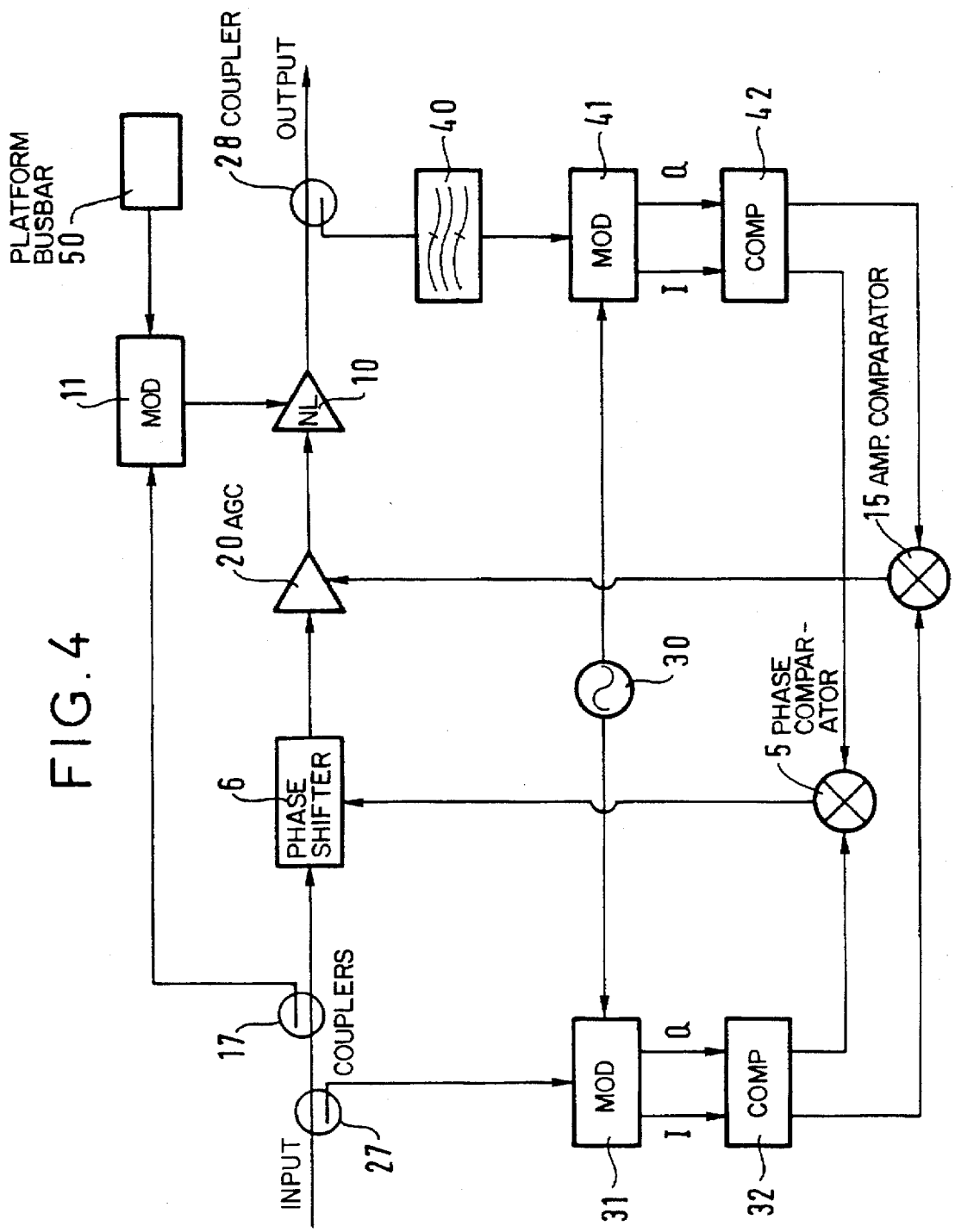
FIG. 4 shows a further embodiment of an amplitude and phase linearization circuit of the invention using digital means to calculate the corrections to be applied in respective feedback loops and an open loop which operates on the power supply modulator.

FIG. 4 shows a further embodiment of the invention using digital means to calculate the corrections to be applied to the phase and to the amplitude in respective feedback loops and an analog open loop operating on the power supply modulator 11, as in the FIG. 2 embodiment.

The latter loop is identical to that of FIG. 2 and will not be described again here. However, its operating principle will be summarized.

The power supply modulator 11 receives at its control voltage input Vc the (modulated) input signal voltage. The power supply voltage of the NL amplifier 10 is then modulated by the image of the RF input signal.

The input-output RF signals are demodulated into their I and Q components by first and second digital demodulators (31, 41) known as an "analytical head", this analytical head comprising an analog-to-digital converter which samples the signal at its input after which an internal algorithm restores the phase and quadrature components I and Q of the modulating signal.

After the digital computations effected by the respective computers 32, 42, the output power, input power, output phase and input phase information are compared in the phase comparator 5 and the amplitude comparator 15 to determine the corresponding phase error and amplitude error.

The phase error controls a digital input phase-shifter 6 to predistort the input phase so that the combination of the phase-shifter 6 and the amplifier 10 does not cause any distortion of the phase of the signal transmitted.

The amplitude error controls an AGC stage 20 for compensating residual amplitude distortion and causing the NL amplifier 10 to operate at its maximum operating point.

The person skilled in the art will readily conceive of other embodiments of the invention based on the general principles explained hereinabove, i.e. without departing from the scope of the invention. Many modifications and the substitution of equivalent means for means as described above are also within the scope of the following claims.

What is claimed:

1. A method of linearizing a non-linear amplifier, comprising correction of phase non-linearity and correction of amplitude non-linearity, said method comprising the steps of:

correcting said phase non-linearity by an electrically controlled phase-shifter on the input side of said non-linear amplifier, said phase-shifter being controlled by a phase comparator which measures phase non linearity introduced by said nonlinear amplifier in a first feedback loop, and correcting said amplitude non-linearity by operating on a power supply modulator of said non-linear amplifier in an open loop configuration and by controlling an automatic gain control amplifier on the input side of said non-linear amplifier by an input-output amplitude error signal generated in a second feedback loop.

2. A linearizer circuit for a non-linear amplifier, adapted to operate at microwave frequencies, including means for correcting phase non-linearity and means for correcting amplitude non-linearity, said phase correction means including a phase comparator coupled to compare the phases of signals from input and output sides of said non-linear amplifier and generating a control signal in accordance with said comparison, and an electrically controlled phase-shifter connected with said phase comparator in a feedback loop and controlled by said control signal, said amplitude non-linearity correction means including:

a power supply modulator for modulating a power supply of said non-linear amplifier, the output voltage of said modulator being controlled by the amplitude of said input side signal in an open-loop configuration, and an automatic gain control (AGC) amplifier on the input side of said non-linear amplifier, said AGC amplifier being controlled in a closed loop configuration by an output signal from an amplitude comparator coupled to compare amplitudes of said input and output side signals.

3. A linearizer circuit for a non-linear amplifier, adapted to operate at microwave frequencies, including phase non-linearity correction means and amplitude nonlinearity correction means, said phase correction means including:

an electrically controlled phase-shifter controlled by a first control signal, a phase comparator having at least two inputs and one output and producing at said output a signal corresponding to the relative phase difference between the signals at said two inputs, a first input coupler on the input side of said nonlinear amplifier and a first output coupler on the output side of said non-linear amplifier, said first input coupler providing a first input coupler signal representative of the phase of said input side signal before amplification to one of said inputs of said phase comparator and said first output coupler providing a signal representative of the phase of said output side signal after amplification to the other of said two inputs of said phase comparator, said output of said phase comparator being coupled as said first control signal to the control input of said phase-shifter in order to control the phase of said input signal in such manner as to cancel any phase non-linearity due to non-linear amplification;

and said amplitude non-linearity correction means including:

a power supply modulator for modulating a power supply of said non-linear amplifier, the output voltage of said power supply modulator being electrically controlled by a second control signal applied to a control input of said modulator, a power comparator having at least two inputs and one output, said power comparator receiving at its inputs said second input coupler and second output coupler signals and providing at its output a power control signal corresponding to a difference in amplitude of said second input and output coupler signals a second input coupler on the input side of said nonlinear amplifier and a second output coupler on the output side of said non-linear amplifier, an automatic gain control (AGC) amplifier in series with and on the input side of said non-linear amplifier, the gain of said AGC amplifier being electrically controllable in accordance with said power control signal, said second input coupler providing a second input coupler signal representative of the amplitude of said input side signal as said second control signal to said control input of said modulator in order to control the supply voltage of said non-linear amplifier, said second input coupler also providing said second input coupler signal to one of said inputs of said power comparator and the second output coupler providing a second output coupler signal representative of the amplitude of the output signal after amplification to the other of said inputs of said power comparator, producing a signal representative of an input-output amplitude error between the second input and second output coupler signals, said error signal being applied to the control input of said automatic gain control amplifier in order to control the amplitude of the input signal in such manner as to cancel any amplitude non-linearity due to non-linear amplification.

4. A linearizer circuit for a non-linear amplifier, adapted to operate at microwave frequencies, including phase non-linearity correction means and amplitude nonlinearity correction means, said amplitude correction means including a power comparator coupled to compare the amplitudes of signals from input and output sides of said non-linear amplifier and generating a control signal in accordance with said comparison, and a power supply modulator connected with said power comparator in a feedback loop and controlled by the amplitude of the error signal; said phase non-linearity correction means including:

a phase comparator having first and second inputs and receiving on its first input a signal representative of the phase of the input signal before amplification, and receiving on its second input a signal representative of the phase of the output signal after amplification, the output of said phase comparator providing a phase error signal, and an automatic gain control amplifier connected for amplification of the signal on the input side of said non-linear amplifier and controlled by the output of said phase comparator in a closed loop configuration.

5. A circuit according to claim 2, wherein said phase correction means and said amplitude correction means comprise first and second analog-to-digital conversion means and first and second digital computation means, the respective means being disposed to process separately a signal representative of the input signal before amplification and a signal representative of the output signal after amplification; said first and second analog-to-digital conversion means providing at their respective outputs a phase signal I and a quadrature signal Q at the respective inputs of said first and second digital computation means; said first and second digital computation means providing at their respective outputs a phase signal and an amplitude signal representative of the input signal before amplification and of the output signal after amplification, respectively; said phase signals being applied to a digital phase comparator the output signal of which constitutes a phase error signal which is applied to a phase-shifter in order to effect said phase correction in a feedback loop, said amplitude signals being applied to a digital amplitude comparator the output signal of which constitutes an amplitude error signal which is applied to the control input of an automatic gain control amplifier in series with and on the input side of the non-linear amplifier in order to effect fine amplitude correction in a feedback loop.

* * * * *